United States Patent
Hsu et al.

(10) Patent No.: US 6,198,677 B1
(45) Date of Patent: Mar. 6, 2001

(54) BOOSTED SENSING GROUND CIRCUIT

(75) Inventors: Louis Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/221,629

(22) Filed: Dec. 29, 1998

(51) Int. Cl.[7] ....................................................... G11C 7/00
(52) U.S. Cl. ............................ 365/203; 365/203; 365/207
(58) Field of Search .................................... 365/206, 205, 365/203, 207

(56) References Cited

U.S. PATENT DOCUMENTS

| | | | |
|---|---|---|---|
| 5,257,232 | 10/1993 | Dhong et al. | 365/226 |
| 5,508,965 | * 4/1996 | Nomura et al. | 365/206 |
| 5,619,465 | * 4/1997 | Nomura et al. | 365/206 |
| 5,646,900 | * 7/1997 | Tsukude et al. | 365/203 |
| 5,949,729 | * 9/1999 | Suyama et al. | 365/206 |

OTHER PUBLICATIONS

Tsukasa Ooishi, et al., "An Automatic Temperature Compensation of Internal Sense Ground for Subquarter Micron DRAM's," IEEE Journal of Solid–State Circuits, vol. 30, No. 4 (Apr. 1995).

Takahiro Tsuruda, et al. "High–Speed/High–Bandwidth Design Methodologies for On–Chip DRAM Core Multimedia System LSI's," IEEE Journal of Solid–State Circuits, vol. 32, No. 3 (Mar. 1997).

* cited by examiner

*Primary Examiner*—Son T. Dinh
(74) *Attorney, Agent, or Firm*—Scully, Scott, Murphy & Presser; Wayne L. Ellenbogen, Esq.

(57) ABSTRACT

A new noise control circuit which connects the sense ground node to ground in two specific period of times so that the NSA bouncing is minimized. Preferably these two periods are at the beginning of setting the n-type latch and when the data is transferring and CSL is switching. A pulse of NSET and together with whole CSLEN signal are used to activate the noise control circuit. The noise control circuit can also include a n-FET diode with its gate connected to the source and its drain tied to the Vbleq power supply. It is more preferable to use a low threshold voltage of n-FET device with Vt at 0.55 volts to form the clamp diode.

21 Claims, 9 Drawing Sheets

NFET COLUMN SELECT SWITCH

**TOO SMALL PFET COLUMN SELECT SWITCH
(FAIL TO SWITCH)**

LARGER PFET COLUMN SELECT SWITCH

NOISE CONTROL ONLY WITH COLUMN SELECT SWITCH SIGNAL

NOISE CONTROL ONLY WITH BOTH COLUMN SELECT SWITCH AND NSET PULSE

LOW VOLTAGE PULL-UP DIODE

HIGH VOLTAGE PULL-UP DIODE

NO PULL-UP DIODE

BOOSTED SENSING GROUND CIRCUIT

FIELD OF THE INVENTION

It was proposed in IEEE Journal of Solid State Circuits, Vol. 30, No.4, April, 1995, p.471 a concept of boosting the ground level of the sense amplifier. The purpose of the Boosted Sense Ground (BSG) implementation is to reduce the current leakage of the unsolicited cells. One major disadvantage is that the boosted ground voltage is very unstable and tends to be disturbed during sensing as well as data transferring. The BSG voltage level is generally about 0.3 to 0.6 volts which is generated by an internal charge pump and distributed among the arrays. As to those skilled in the art should know such a low voltage level is inherently harder to generate than those of higher voltage levels. Also due to the limited design area for the charge pump, a strong pump is usually not available. Under this circumstance, to maintain the BSG level would be very difficult. To solve this problem, the above-identified article proposed a column decoded sensing scheme, where a complicated sense amplifier was designed with large number of devices. This develops a much larger array size.

Thus the need exists for an improved DRAM array sensing techniques for low voltage operation using a boosted sense ground scheme that is more stable. The solution should be at least as or more effective and the circuit size more compact than existing circuits. The present invention addresses these needs.

SUMMARY OF THE INVENTION

An object of this invention is to provide as improved memory array sensing technique for low voltage operation using a boosted sense ground scheme that is more stable.

Another object of the present invention is to provide an improved DRAM array sensing technique for low voltage operation with a boosted sense ground scheme that is more effective and the circuit size more compact than existing circuits.

These and other objectives are obtained with a new noise control circuit which connects the boosted sense ground node to ground in two specific period of times so that the BSG bouncing is minimized. Preferably these two periods are at the beginning of setting the n-type latch and when the data is transferring and column switch. A pulse of n-latch set signal and together with a control signal are used to activate the noise control circuit. The noise control circuit can also include a n-FET diode with its gate connected to the source and its drain tied to the Bt-line equalization power supply. It is more preferable to use a low threshold voltage of n-FET device with Vt at 0.55 volts to form the clamp diode.

DETAILED DESCRIPTION OF THE PREFERRED EMBODIMENTS

Figure 1:
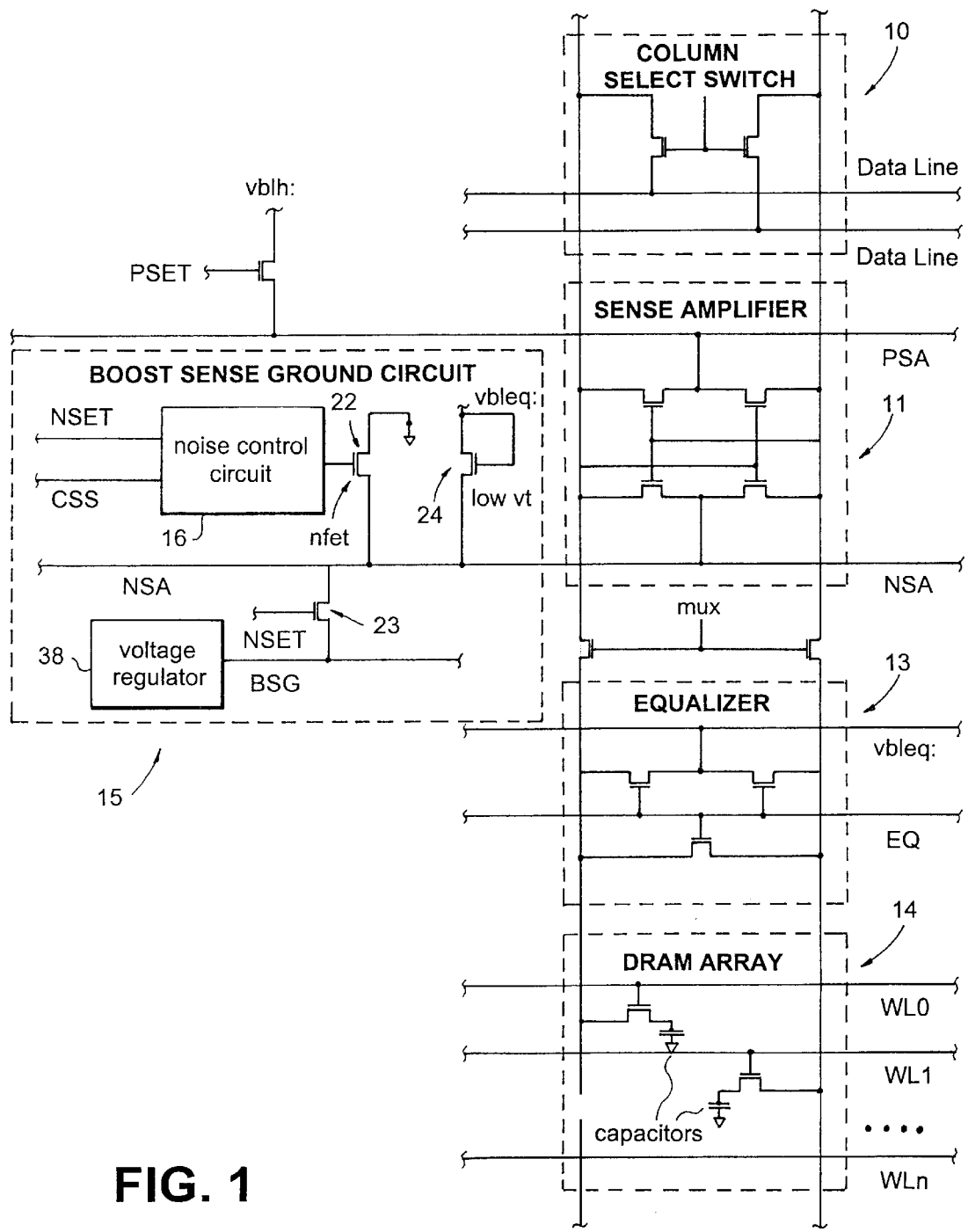
FIG. 1 shows the first embodiment and embodying teachings of this invention.

FIG. 1 depicts an example of a DRAM array having features of the present invention. As depicted, the circuit includes a sense amplifier (11), an equalizer (13), a column select switch or CSS (10), DRAM cell array (14) and a boosted sense ground circuit (15). The boosted sense ground circuit (15) includes a noise control circuit (16), which will be described in more detail with reference to FIG. 2, is provided for each array block.

Our invention is shown in the box of boost sense ground circuit (15). Charge pump 38 supply BSG, or boost sense ground voltage, e.g. 0.4V. NSET, or n-latch sensing signal determines when BSG is shorted to the NSA, or N-latch sense node. The noise control circuit 16 is to generate pulse to discharge NSA node during sensing or column select mode. A low Vt (threshold voltage) diode device 24 is used to clamp the NSA voltage from being dropped below BSG (or 0.4V) level at all time.

Figure 2:
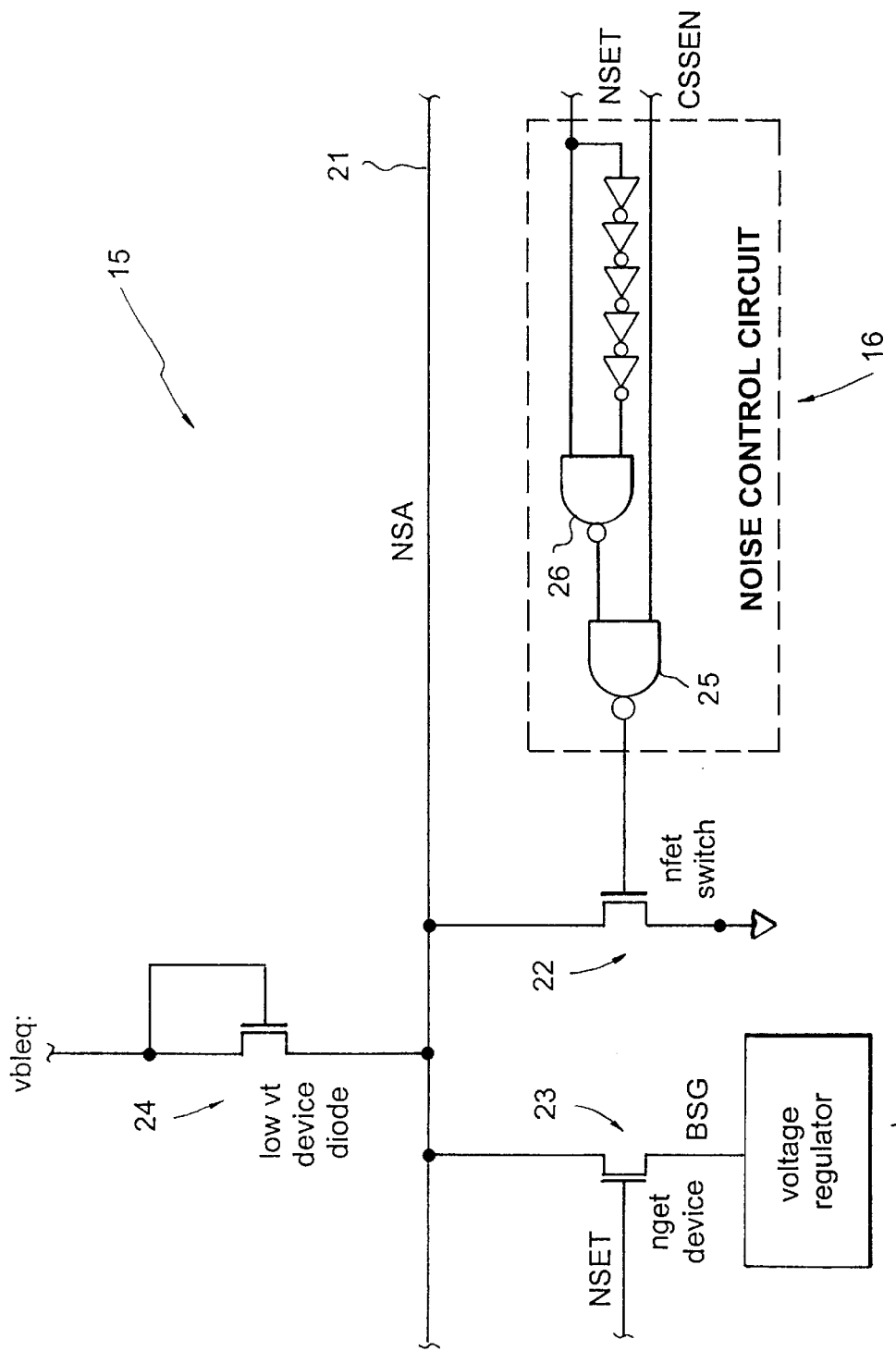
FIG. 2 is a schematic of a noise control circuit of the circuit shown in FIG. 1.

FIG. 2, a full circuit schematic of the boost sense ground circuit is shown. A noise control circuit 16 is designed using the existing signals from the DRAM macro these signals include NSET CSS. etc design to provide signal to discharge the n-latch sense ground NSA line (21) to the ground at a proper timing so that the boosted sense ground level is maintained with the stable noise control. Here we propose to use a diode device which is constructed by a low threshold voltage n-channel FET device (24) with the anode tied to the Vbleq power supply. Furthermore, the noise control circuit is comprised of a pulse generator triggered by the NAND gate (25) function of the NSET signal from the control circuit and the CSS column switch select enable signal, to determine whether the n-latch sense ground NSA node needs to be discharged.

It is discovered that the NSA is subjected to the noise disturbance in two stages. The first case is when the signal from the cell reaches the sense amplifier. At this moment, the NSA node must be tied to ground potential in order to speed up the sensing operation, any excessive charge left from the bit-lines must be quickly discharged. The second case is when the Data line switch is activated the charge from the local Data lines are dumped to the bit-lines which can cause the NSA potential level to bounce rather significantly. Therefore, during the entire period of CSS switching, the n-latch sense ground (or NSA) of the sense amplifier is connected to the ground, through nfet switch 22.

Figure 3A:
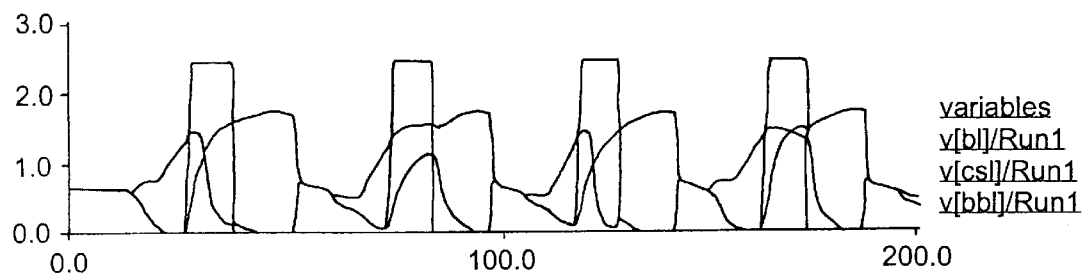
FIG. 3 HSPICE simulation results comparison between using Nfet CSL and Pfet CSL.
Figure 3B:
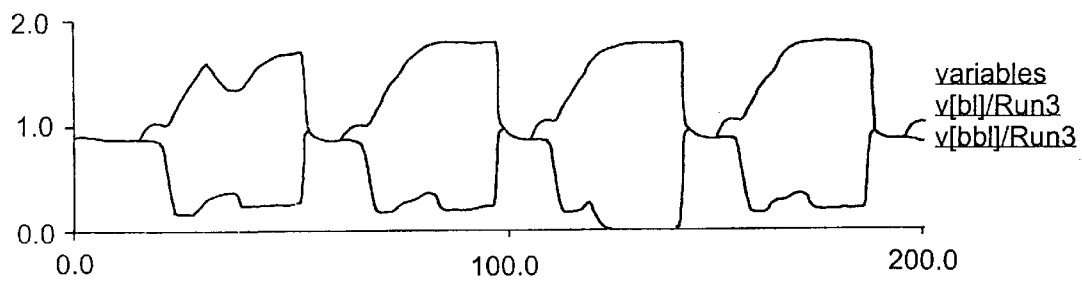
Figure 3C:
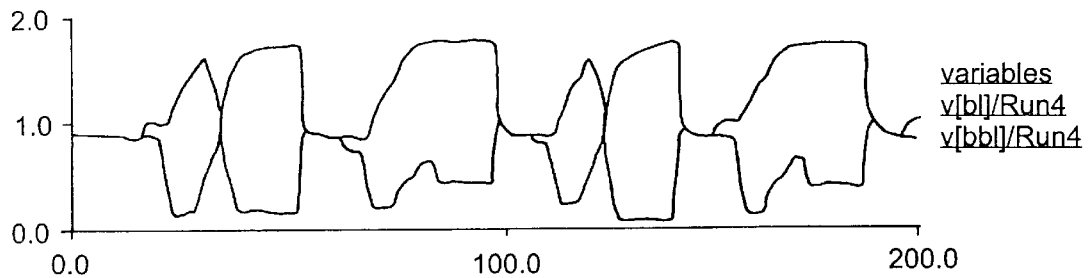

The other approach is to avoid the NSA voltage shift to a level lower than the predetermined charge pump generated voltage level by using p-type CSS switch. In this case, the bit-line at potential low is guaranteed be higher than the p-channel MOSFET threshold voltage. Simulation results are shown in FIG. 3. During Data sensing while BSG is supplied by a voltage regulator 38 the NSA node is tied to BSG through nget device 23.

In FIG. 3, additional HSPICE simulation results is given on:

(1) using a n-FET CSL switch, the voltage of a bit-line is moving lower than the BSG level. Usually this could be avoided with a strong pump, however, we have to assume that a strong pump is not routinely available as we have explained above.

(2) Using a small p-FET CSS is not sufficient enough to properly alter the data in the sense amplifier from the data line.

(3) Using a properly sized p-FET CSS It will function properly. In other words, the size of p-FET CSS is inherently larger than the n-FET CSS.

Figure 4A:
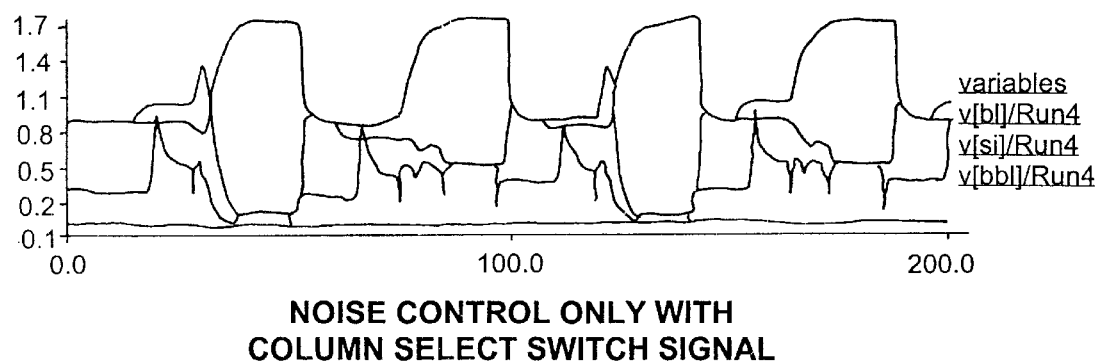
FIG. 4 indicates the optimization of the noise control circuit. HSPICE simulation result from the first embodiment.
Figure 4B:
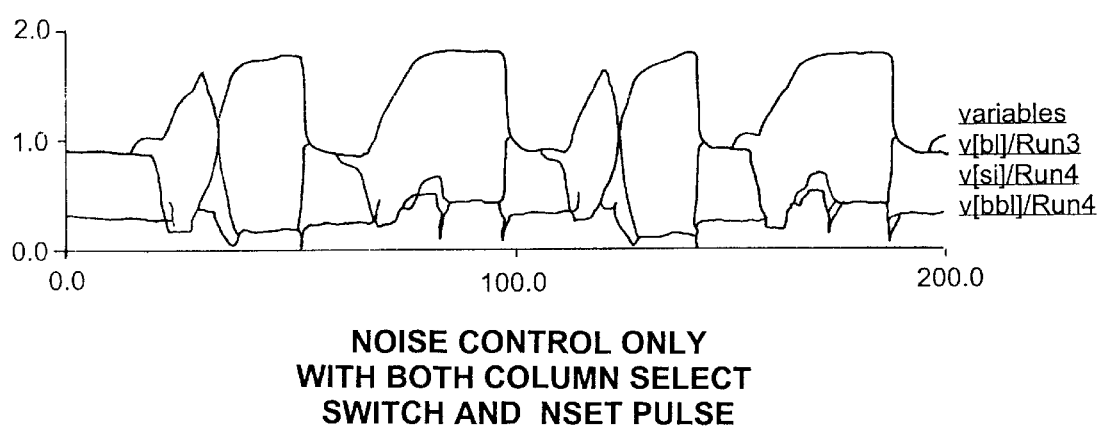
Figure 5A:
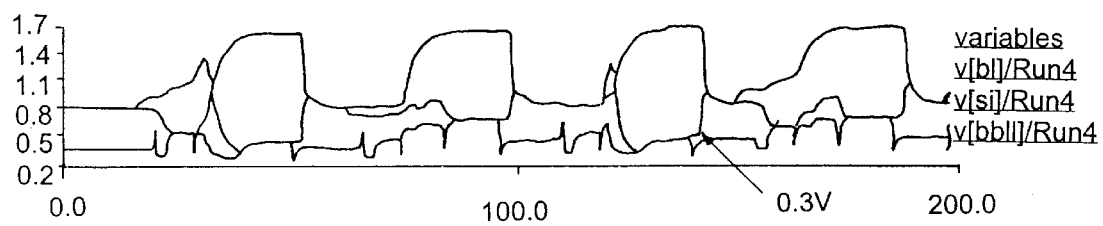
FIG. 5 demonstrates the effectiveness of using the n-FET pull-up diode.
Figure 5B:
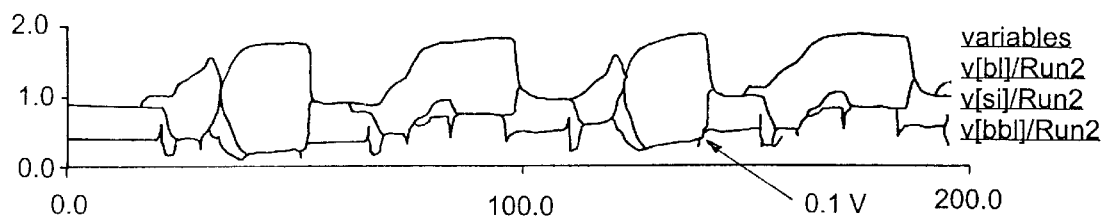
Figure 5C:
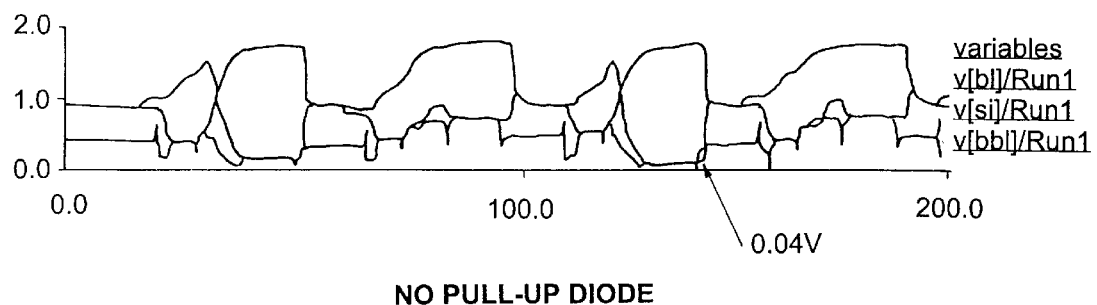
Figure 5D:
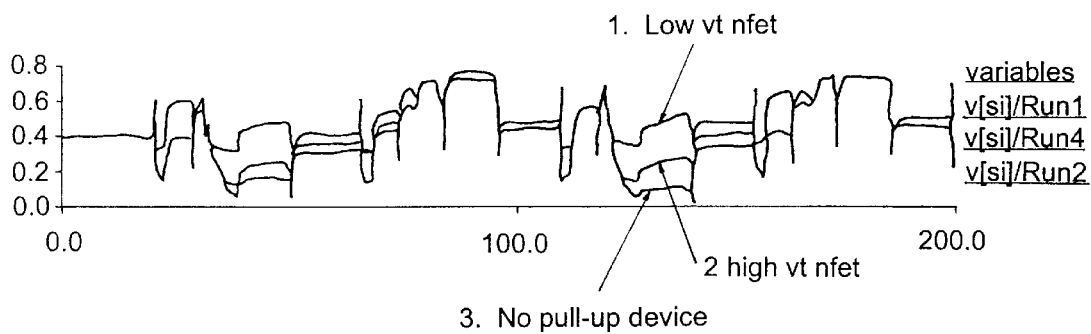

In FIGS. 4a and 4b, the optimization of the noise control circuit design it indicates (1) the noise control circuit without using NSET pulse results in high level of voltage bouncing during the sensing period. (2) While both CSS and NSET signals are used the ground bouncing is reduced.

Finally, in FIG. 5, the effectiveness of using the n-FET pull up diode is demonstrated. (1) With a low Vt n-FET pull-up diode the lowest voltage of the bit-line low is kept at 0.34V, (2) with a regular Vt n-FET diode, the low bit-line level is at 0.16V, while (3) without the use of this device, bit-line low could reach as far as 0.09V, comparing to the targeted BSG level 0.4V, this is lower than desired and may suffer more cell leakage.

Alternative Embodiment

Figure 6:
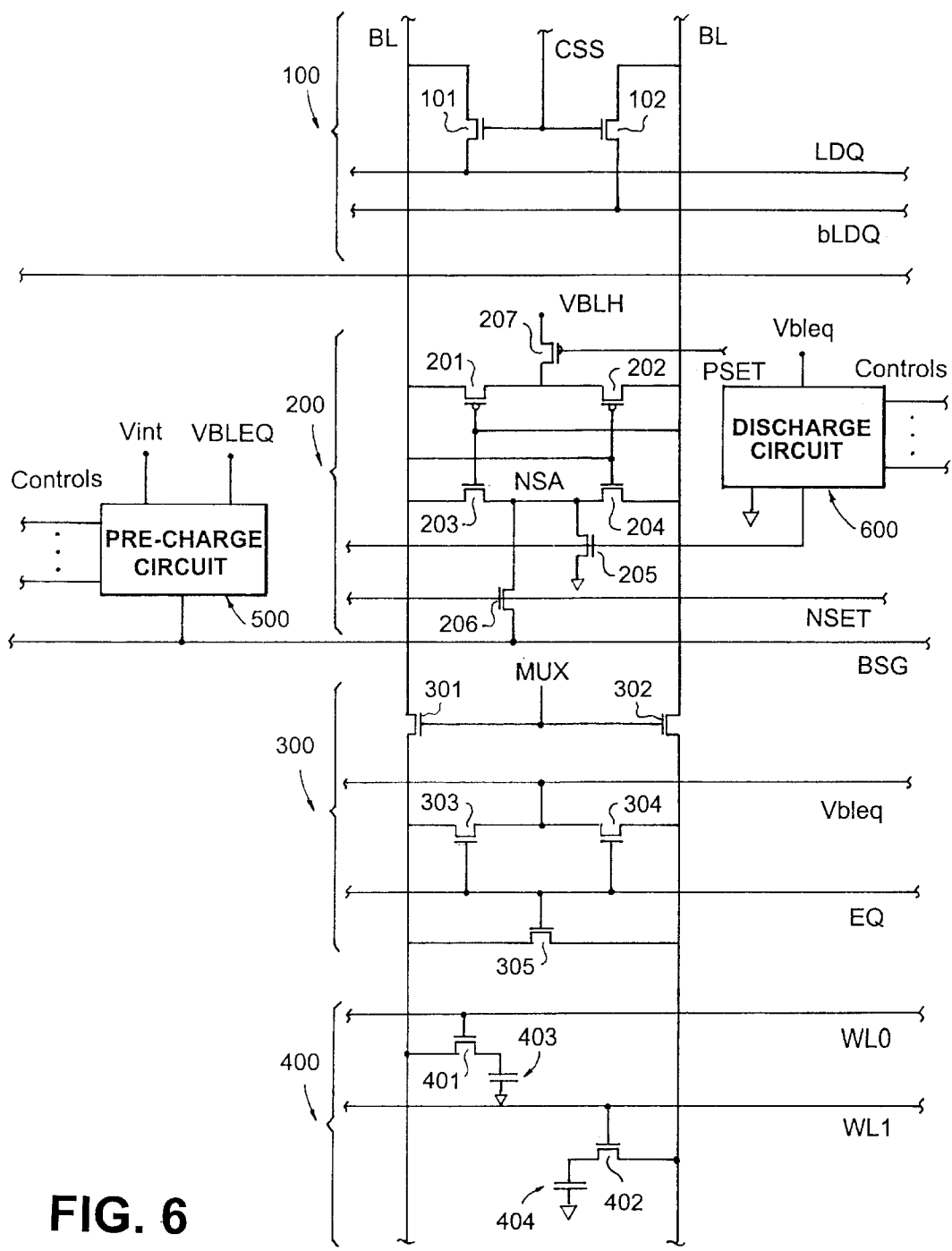
FIG. 6 depicts the second embodiment and teachings of this invention.

FIG. 6 depicts an example of a new boosted ground sense device including component 100 of column select switch (or so called CSS), 200 the n-latch as well as p-latch of the sense amplifier, and 300 sense amplifier switch (or so called MUX), and precharge and equalization component. The portion of the array is shown in 400 with at least 2 cells are shown. The dynamic pre-charge circuit 500 and discharge circuit 600 are also displayed.

The column select switch allows local data communication between data queue lines to the array through the sense amplifier. Two n-fet devices 101, and 102 are connected in such a way that their gates are tied to the switch control CSS. The source of 101 is linked to the bit line BL, while the source of the 102 is linked to the bit line bBL, or the complementary bit line. The drain of the 101 is linked to a local data queue line (or so called LDQ), while the drain of the 102 is linked to the bLDQ (or the complementary data queue line).

The sense amplifier latch component 200 includes of a pair of inverters that tied back to back. In other words, the first inverter includes pfet 201 and nfet 203 with their gates tied together. The second inverter includes of pfet 202 and nfet 204, also with their gates tied together. The gate of the first inverter is linked to the complementary bit line, while the gate of the second inverter is linked to the bit line. It is well know to the art, that such connection will form a latch where data can be stored. Now, the drain of pfet 201 is linked to BL while drain of 202 to bBL. The source of them are tied together and is connected to the drain of another pfet device 207. This pfet device 207 is also called the set device for p-latch. Its gate is triggered by PSET, and source is linked to the bit line high supply (so called bit-line high supply vblh, e.g. 1.8V). On the other hand, the source of nfet 203 is linked to BL and the source of nfet 204 is linked to bBL. Again their drains are tied together. In this invention we have two set devices for the n-type latch. These are nfet 205 to the ground, and nfet 206 to the boosted sense ground line (or so called BSG line). The set device 206, its gate is triggered by the NSET control signal, while the set device 205, its gate is triggered by an output signal from the discharge circuit 600, and will be discussed later.

The equalization component 300 includes a pair of switches nfet 301 and nfet 302. Their gates are controlled by the signal of MUX. This switch determines which array is selected for sensing. Sometimes, one sense amplifier is shared by two arrays, upper and lower. Here, only the lower array is shown in FIG. 6. nfet 303, 304 and 305 are used to precharge and equalize the BL and bBL. This is done when the control signal EQ is activated. The voltage between BL and bBL is balanced via connecting them to a bit line equalization source (or so called Bit-line equalization supply Vbleq, e.g. 0.90V).

The array area includes multiple of cells. Each cell is represented as a transfer gate, here is a nfet 401, and a capacitor 403. The gate of the transfer gate is tied to a word line (e.g. WL0). The source of the transfer gate 401 is tied to the BL. On the other hand, the second cell as shown has a transfer gate 402, and it gate tied to another word line WL1, and its source tied to bBL, and drain connected to the second capacitor 404. The other terminal of the capacitor is not necessarily tied to ground, but for the simplicity, here it is tied to the ground.

Figure 7:
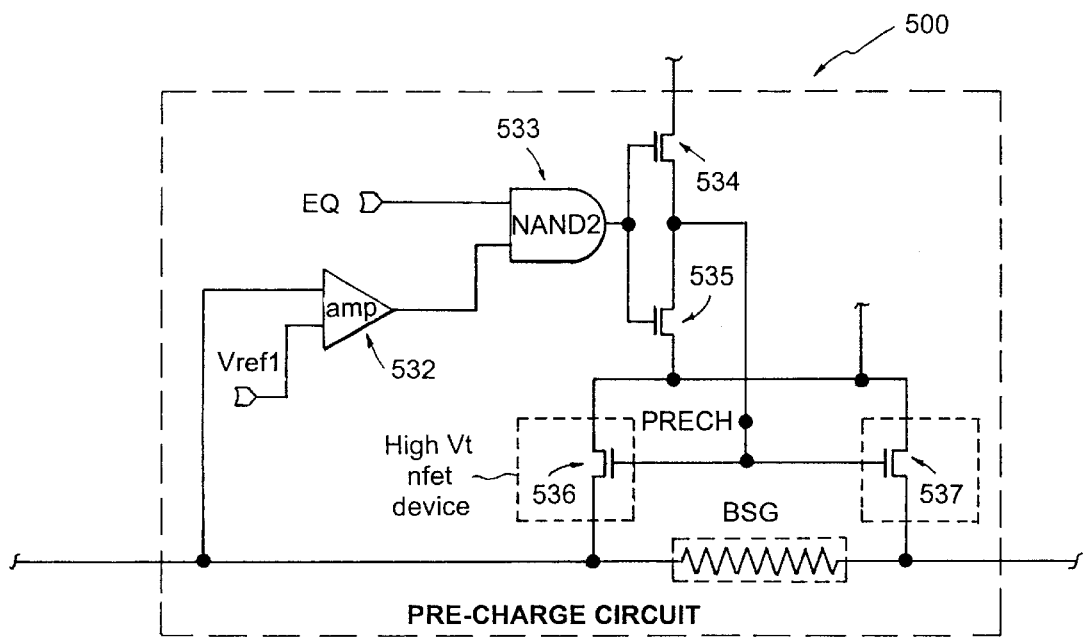
FIG. 7 shows details of a BSG precharge circuit used in FIG. 6.

The BSG precharge circuit 500 includes some power lines such as Vint (the on-chip generated internal voltage) and Vbleq, and some control signals. The details of this circuit is shown in FIG. 7. The purpose of this component is to make sure that the boosted sense ground line is maintained at the predetermined level (e.g. 0.3V) during sense amplifier evaluation.

Figure 8:
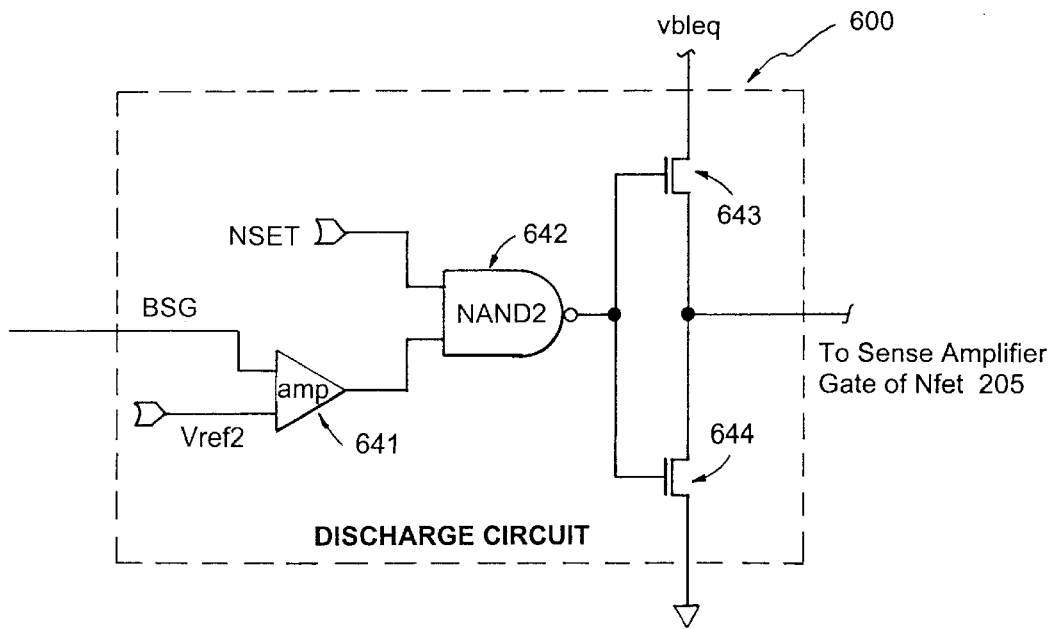
FIG. 8 shows details of a BSG discharge circuit used in FIG. 6.

The Discharge circuit of n-type latch internal node, (or so called NSA), 600 includes power lines such as Vbleq, and some control signals. The details of this circuit is shown in FIG. 8. The purpose of this component is to make sure that the NSA level is maintained at the predetermined level (e.g. 0.90V) during precharge and equalization period.

The full schematic of the BSG precharge circuit is shown in FIG. 7. First, we must distinguish the BSG precharge from the BL precharge. The BSG precharge is done by circuit shown in FIG. 4, while the BL precharge is done by component 300 shown in FIG. 6. The BSG precharge is done at the beginning of BL precharge, and thus is also triggered by the EQ signal. A reference voltage Vref1 (e.g. 0.90V, or Vbleq level) is fed to a differential amplifier 532. So the BSG level is compared to Vref1. If the BSG level is lower than the Vref1, the output of diff-amp 532 will rise. Together with EQ signal through an NAND gate 533, the output of NAND 533 will first turn pfet 534 on to allow nfet device 536 and 537 to turn on and connect to the Vbleq supply. As the result, the BSG line will soon pulled up to the Vbleq level. Notice that the pulse generated to precharge the BSG line is called "PRECH" and can be seen in a waveform diagram FIG. 9 on curve 5. When the BSG level is precharge to Vbleq at the beginning of the BL precharge and equalization period, the differential amplifier 532 will shut the path off between BSG and Vbleq, and the PRECH node will be floating.

The full schematic of the NSA discharge circuit is shown in FIG. 8. First, the BSG level is compared to another reference voltage Vref2 (e.g. 0.3V, or the predetermined BSG level). If BSG is higher than the Vref2 level, the output of the second differential amplifier will be high. During the evaluation NSET is set high together with an NAND gate 642, its output will turn pfet 643 on so that the first n-type set device 205 in FIG. 6 will help to discharge the internal node "NSA" of the n latch of the sense amplifier. This done by connecting the gate of the 205 to the vbleq supply. When the BSG is lower to about the targeted voltage (e.g. 0.3V) the path is shut off. Such BSG discharge curve is shown as curve 3 in the waveform of FIG. 9 This discharge of the BSG line will boost the sensing speed. Also, since the trigger voltage is only up to vbleq (e.g. 0.90V), the power saving is significant.

Figure 9:
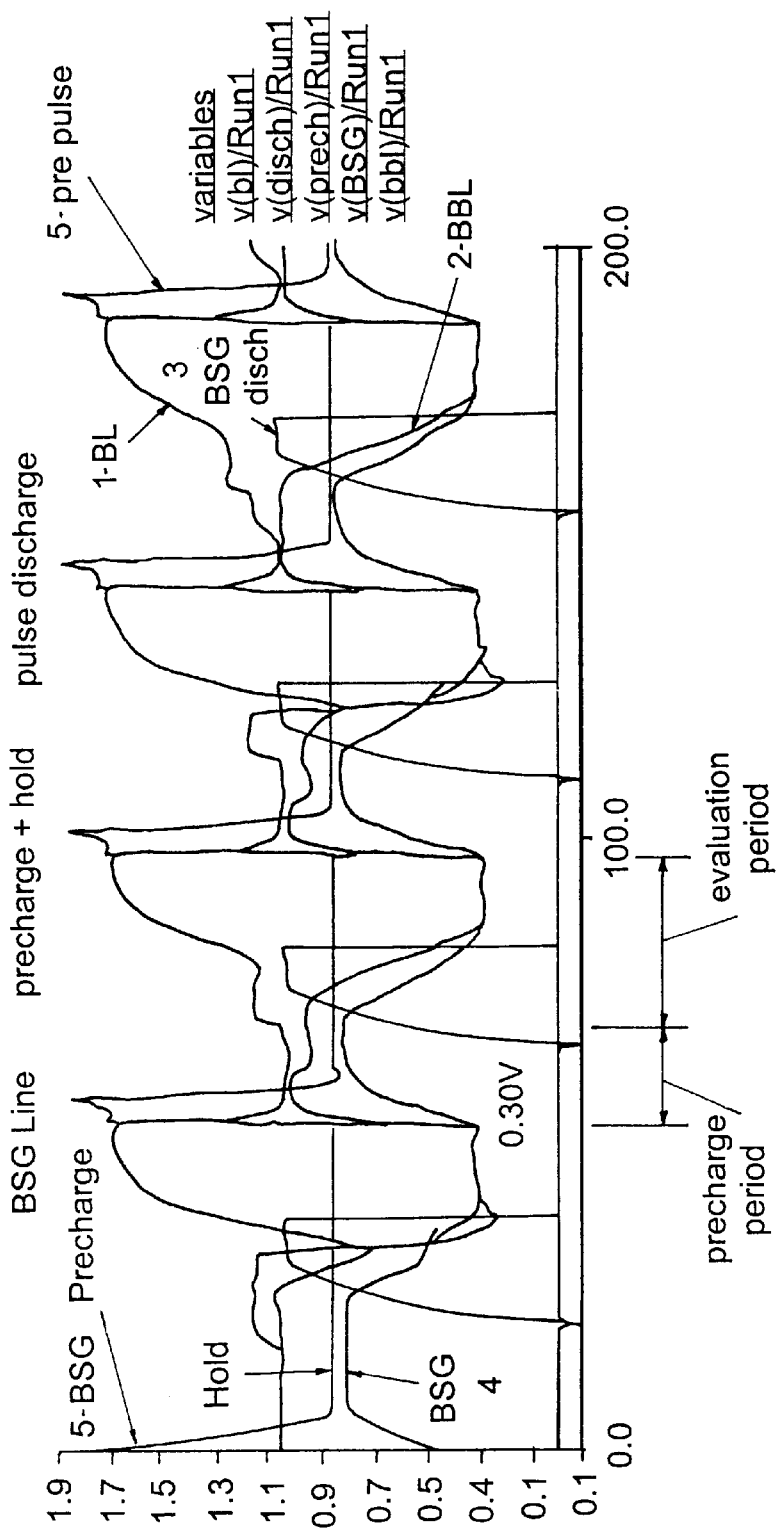
FIG. 9 shows the results of an HSPICE simulation by the second embodiment.

In FIG. 9, the over-all waveform of the dynamic BSG operation. Curve 1 and 2 are the BL and bBL, respectively. The BL precharge period and the evaluation periods are also indicated. The BSG level as shown curve 4, is moved from Vbleq (or 0.90V) during the BL precharge period to BSG (or 0.3V) during the evaluation period. The level of BSG precharge pulse varies from Vbleq to Vblh as shown in curve 5. The level of BSG discharge pulse varies from ground to vbleq as shown in curve 3 of FIG. 9.

While the invention has been particularly shown and described with respect to illustrative and performed embodiments thereof, it will be understood by those skilled in the art that the foregoing and other changes in form and details may be made therein without departing from the spirit and scope of the invention which should be linked only by the scope of the appended claims.

Having thus described our invention, what we claim as new, and desire to secure by Letters Patent is:

1. A Boosted Sense Ground Circuit for boosting the ground level of a sense amplifier, comprising:
    a voltage source for supplying a boosted ground level voltage;
    a node connected to the voltage source for applying the boosted ground level voltage to the sense amplifier; and
    a ground connect subcircuit for connecting the node to ground at defined periods to reduce fluctuations in the boosted ground level voltage.

2. A circuit according to claim 1, wherein the defined Periods include during array sensing.

3. A circuit according to claim 1, wherein the defined periods include during data transfer.

4. A boosted sense ground circuit according to claim 1, wherein the defined periods are at the beginning of setting the sense amplifier and when data is transferring.

5. A boosted sense ground circuit according to claim 1, further comprising a n-FET device with its gate tied to a pulse sensor, its drain tied to the node, and its source tied to ground so as to conditionally discharge the node.

6. A boosted sense ground circuit according to claim 1, further comprising a n-FET diode with its gate connected to the drain, and both the gate and drain tied to a Vbleq power supply.

7. A boosted sense ground circuit according to claim 1, wherein a p-type column switch is used to prevent the bit line to swing lower than the predetermined the level when the switch is turned on.

8. A dynamic boosted sense ground circuit for boosting the ground level of a sense amplifier, the circuit comprising:
    a voltage source for supplying a boosted ground level voltage;
    a node connected to the voltage source for applying the boosted ground level voltage to the sense amplifier;
    a precharge component for sensing the voltage of the node at first defined times, and for applying a precharge voltage to the node if the sensed voltage is below a given threshold; and
    a discharge component for sensing the voltage of the node at second defined times, for discharging the node if the voltage sensed by the discharge component is above a preset threshold.

9. A dynamic boosted sense ground according to claim 8, wherein two n-type set devices are required for the sense amplifier, the first set device is triggered by the boosted sense ground discharge circuit during an evaluation period; the second set device is triggered by a set signal also during the evaluation period.

10. A noise control circuit according to claim 8, wherein during evaluation, the boosted sense ground discharge circuit comparing the boosted sense ground level to a first referenced level which is the sense low level; when boosted sense ground level is exceed the sense low level, then a pulse is generated to trigger the first set device so the sensing speed is improved.

11. A noise control circuit according to claim 8, wherein during precharge, the boosted sense ground precharge circuit comparing the boosted sense ground level to a second referenced level which is the bitline equalization level; if the boosted sense ground level is lower than the bitline equalization level, then the precharge circuit will precharge the boosted sense ground to the bitline equalization level and so that the sense amplifier will be ready for the next evaluation period.

12. A noise control circuit according to claim 8, wherein the boosted sense ground precharge pulse is a pulse with its low level at bitline equalization level and its high level at bitline high level.

13. A noise control circuit according to claim 8, wherein the BSG discharge pulse is a pulse with its low level at ground, and its high at bit line equalization level.

14. A circuit according to claim 8, wherein:
    the precharge component includes an output line connected to the sense amplifier, and a first subcircuit having an activated state for applying the precharge voltage to the node;
    the discharge component includes a second subcircuit having an activated state for discharging the node; and
    the circuit further comprises control means to activate the precharge component during sense amplifier evaluation periods, and to activate the discharge component during the precharge and equalization periods.

15. A circuit according to claim 14, wherein:
    the circuit is for use with a DRAM macro design; and
    the circuit is designed using the existing signal from the DRAM macro design to provide signal to discharge the boosted sense ground NSA line to the ground at a proper timing so that the boosted sense ground level is maintained with the stable noise control.

16. A method of operating a Boosted Sense Ground Circuit for boosting the ground level of a snese amplifier, the method comprising the steps:
    providing a voltage source for supplying a boosted ground level voltage;
    using a node, connected to the voltage source, for applying the boosted ground level voltage to the sense amplifier; and
    providing a ground connect subcircuit for connecting the node to ground at defined periods to reduce fluctuations in the boosted ground level voltage.

17. A method according to claim 16, wherein the defined periods include during array sensing.

18. A method according to claim 16, wherein the defined periods include during data transfer.

19. A method according to claim 16, wherein the defined periods are at the beginning of setting the sense amplifier and when data is transferring.

20. A boosted sense ground circuit according to claim 1, wherein the ground connect subcircuit includes:
    a switching element located in series between the node and ground, and having an activated state for connecting the node to ground; and a controller connected to the switching element for activating the switching element to connect the node to ground.

21. A boosted sense ground circuit according to claim 1, further comprising a clamp connected to the node to prevent the voltage of the node from dropping below a threshold level when the ground connect subcircuit connects the node to ground.

* * * * *

UNITED STATES PATENT AND TRADEMARK OFFICE
CERTIFICATE OF CORRECTION

PATENT NO. : 6,198,677 B1
DATED : March 6, 2001
INVENTOR(S) : L. Hsu et al.

It is certified that error appears in the above-identified patent and that said Letters Patent is hereby corrected as shown below:

Column 1,
Line 4, after "FIELD OF THE INVENTION," insert -- The present invention related to memory array sensing techniques and in particular to DRAM array sensing techniques for low voltage operation using a boosted sense ground. --.
Line 4, insert -- BACKROUND OF THE INVENTION --.

Column 5, claim 2,
Line 32, "Periods" should read -- periods --.

Column 5, claim 8
Line 62, "times, for" should read -- times, and for --.

Signed and Sealed this

Second Day of April, 2002

*Attest:*

JAMES E. ROGAN
*Director of the United States Patent and Trademark Office*

*Attesting Officer*